US008964862B2

(12) United States Patent
Himmelstoss

(10) Patent No.: US 8,964,862 B2
(45) Date of Patent: Feb. 24, 2015

(54) TRANSMISSION METHOD AND SYSTEM

(75) Inventor: Armin Himmelstoss, Weissach Im Tal (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 13/881,937

(22) PCT Filed: Sep. 1, 2011

(86) PCT No.: PCT/EP2011/065102
§ 371 (c)(1),
(2), (4) Date: Jul. 9, 2013

(87) PCT Pub. No.: WO2012/055615
PCT Pub. Date: May 3, 2012

(65) Prior Publication Data
US 2013/0279608 A1    Oct. 24, 2013

(30) Foreign Application Priority Data
Oct. 26, 2010   (DE) .......................... 10 2010 042 903

(51) Int. Cl.
*H04B 3/00*     (2006.01)
*H04B 3/02*     (2006.01)
*H03L 7/197*    (2006.01)
(Continued)

(52) U.S. Cl.
CPC  *H04B 3/02* (2013.01); *H03L 7/197* (2013.01);
*H03M 9/00* (2013.01); *H04B 15/02* (2013.01);
*H04L 7/0008* (2013.01); *H04L 25/028*
(2013.01); *H04B 2215/067* (2013.01)
USPC ........... 375/257; 375/258; 375/285; 375/295;
375/316; 375/354

(58) Field of Classification Search
CPC .......... G09G 3/3611; G09G 2330/021; G09G
3/2014; G09G 3/2022; G09G 3/3696; G09G
2310/0229; G09G 2340/0414; G09G
2340/0421; G09G 5/005; G09G 5/006;
G09G 5/008; G02B 26/101; G02B 23/24;
G02B 23/2469; H04N 1/32358; H04N
2005/2255; H04N 5/14; H04N 5/2256;
H04N 5/33; H04N 5/46; H04N 5/66; H04N
7/0105; H04N 7/0135; H04N 9/10; H04N
9/3129; H04N 9/641; H04N 1/047; H04N
1/207; H04N 1/3875
USPC ......... 375/223, 254, 256, 257, 285, 293, 295,
375/316, 346, 354, 377
See application file for complete search history.

(56) References Cited

U.S. PATENT DOCUMENTS 3,855,617 A * 12/1974 Jankowski et al. ............. 360/32
4,751,699 A *  6/1988 Tarridec et al. ............... 370/538
(Continued)

FOREIGN PATENT DOCUMENTS

JP        60 49432      3/1985
JP      2006-237723     9/2006
JP      2009-171250     7/2009

OTHER PUBLICATIONS

International Search Report, International Application No. PCT/EP2011/065102, dated Nov. 30, 2011.

*Primary Examiner* — Hirdepal Singh
(74) *Attorney, Agent, or Firm* — Kenyon & Kenyon LLP

(57) ABSTRACT

A method for transmitting digital data via a line includes the steps of providing a clock signal and of transmitting the digital data in synchrony with the clock signal, the clock signal having a frequency that is variable over time.

8 Claims, 3 Drawing Sheets

(51) Int. Cl.
*H03M 9/00* (2006.01)
*H04B 15/02* (2006.01)
*H04L 7/00* (2006.01)
*H04L 25/02* (2006.01)

(56) References Cited

U.S. PATENT DOCUMENTS

| 7,386,028 | B2 * | 6/2008 | Egan et al. | 375/130 |
| 7,463,675 | B2 * | 12/2008 | Scott et al. | 375/220 |
| 8,264,451 | B2 * | 9/2012 | Kimura | 345/102 |
| 8,744,262 | B2 * | 6/2014 | Barnard | 398/49 |
| 2002/0061061 | A1 * | 5/2002 | Young et al. | 375/222 |
| 2005/0003785 | A1 * | 1/2005 | Jackson et al. | 455/260 |
| 2005/0069019 | A1 * | 3/2005 | Kaizuka | 375/130 |
| 2005/0091549 | A1 * | 4/2005 | Wu et al. | 713/320 |
| 2006/0280231 | A1 * | 12/2006 | Sorrells et al. | 375/147 |
| 2008/0075194 | A1 * | 3/2008 | Ravi et al. | 375/297 |
| 2008/0259221 | A1 * | 10/2008 | Longchambon et al. | 348/739 |
| 2009/0083567 | A1 * | 3/2009 | Kim et al. | 713/501 |

* cited by examiner

TRANSMISSION METHOD AND SYSTEM

FIELD

The present invention relates to a transmission method for transmitting digital data via a line. Moreover, the present invention relates to a system for transmitting digital data via a line.

BACKGROUND INFORMATION

When transmitting digital data via a line, electromagnetic interference which is proportional to a transmission rate of the data can arise in the region of the line. Conventionally, an increase in the data transmission rate also goes hand in hand with the production of interference signals having higher frequencies. Conventional measures for suppressing such interference include shields and ground surfaces. Since high-frequency signals tend to radiate from the line more readily, their suppression likewise requires greater effort as the frequency of the interference rises. The interference may be radiated from the line in the form of electromagnetic waves or it may propagate along the line.

In order to reduce the required connections between a transmitter and a receiver, a serial transmission of the digital data via the line commonly takes place. At an identical transmission rate, a serial interface must be operated at a faster rate, i.e., at higher frequencies, than a parallel interface, which basically increases the radiation tendency of interference signals at serial interfaces. SPI, I2C, USB, RS232, RS45 and LVDS are typical serial protocols and buses. In a few of these protocols or buses a differential transmission of signals along the conductor is chosen, which doubles the line requirement, but also increases the interference immunity and reduces the emission of interference signals. All of the mentioned protocols or buses use a fixedly predefined data-transmission frequency. Emitted interference signals must therefore be expected only in a frequency band that is able to be defined in advance and is a function of the data transmission rate.

The described interference may also occur in the transmission of measured values from a sensor to a control component. In the environment of motor vehicles, for instance, a sensor together with a multitude of potential electromagnetic interference sources may be used in a widely branched and complex line network. In such an environment, a minimum of interference radiation along or from the line, and resistance to irradiation of electromagnetic interference via the line are usually defined by the specifications of work and services.

In accordance with the present invention, a method and a system are provided for transmitting digital data via a line, which exhibit improved interference characteristics at low expenditure.

SUMMARY

A method for transmitting digital data via a line according to an example embodiment of the present invention includes the steps of providing a clock signal and of transmitting the digital data in synchrony with the clock signal, the clock signal having a frequency that is variable over time.

In this way a frequency band on which electromagnetic interference is able to be radiated or received, is broadened. The energy per frequency is reduced in that the resistance to interference and the radiation of interference per frequency is lower. The improved interference behavior advantageously can be obtained in a relatively simple manner.

Preferably, the frequency is linearly varied in sections. Such a frequency modulation is easy to produce and may permit a simpler setup of the transmission between a transmitter and a receiver of the digital data. The digital data may be coded in binary manner and transmitted serially. This makes the method especially suitable for a serial data transmission, for which a less complex line may be used.

A system according to the present invention for the transmission of digital data includes a transmission device, a receiving device, and a line for transmitting a line signal from the transmission device to the receiving device. The transmission device includes a clock generator in order to provide a clock signal that is variable over time, and a synchronization device to provide the line signal on the basis of a synchronization of the data with the clock signal. The receiving device is equipped with a decoder for decoding the data from the line signal transmitted via the line.

The system according to the present invention advantageously is able to be used especially in environments in which a radiation of electromagnetic signals from the line and a susceptibility to electromagnetic irradiation via the line are critical factors. The line may have different lengths and, for example, may be formed by a cable or by a circuit track on a circuit board. The variation of the clock signal according to the present invention, on the basis of which the data are transmitted via the line, is able to be implemented in a simple and cost-effective manner. As a result, the system is also suitable for devices set up for a multitude of data transmissions.

The line preferably has only one physical channel for the transmission of information. A transmission of the clock signal may be dispensed with. This allows the production cost for the system to be kept low. In one alternative specific embodiment, the clock signal is also transmittable via a separate physical channel, which improves the decoding on the side of the receiving device.

The synchronization device may include a conversion device for converting parallel into serial digital data. Thus, the conversion of data present in parallel form into a form that is transmittable via the line may take place simultaneously with the synchronization to the clock signal having a variable frequency. The synchronization device is able to have a simple design and be developed by a shift register, for example.

The transmission device may include a scanning device for scanning a measured variable, the digital data representing measured values provided by the scanning process.

This makes it possible to integrate the transmission device with a sensor, so that a simple and cost-effective digital sensor is able to be provided, which may be operated with excellent interference behavior in the afore-described system.

A timing generator which is independent of the clock generator may be provided to generate a scanning signal having a constant frequency for the control of the scanning device. The scanning of the measured variable may take place in this manner on the basis of a fixed time pattern, while the transmission of the data representing the measured values may be carried out on the basis of the variable clock signal. This makes it easy to integrate the described system into an existing system that further processes the scanned measured values.

In particular, the sensor device may include a radar sensor. An interference-protected transmission of the measured values obtained via the radar sensor is able to ensure in a simple and reliable manner when using the described system.

The receiving device may include a programmable microcomputer.

BRIEF DESCRIPTION OF THE DRAWINGS

The present invention is described in greater detail below with reference to the accompanying figures.

DETAILED DESCRIPTION OF EXAMPLE EMBODIMENTS

Figure 1:
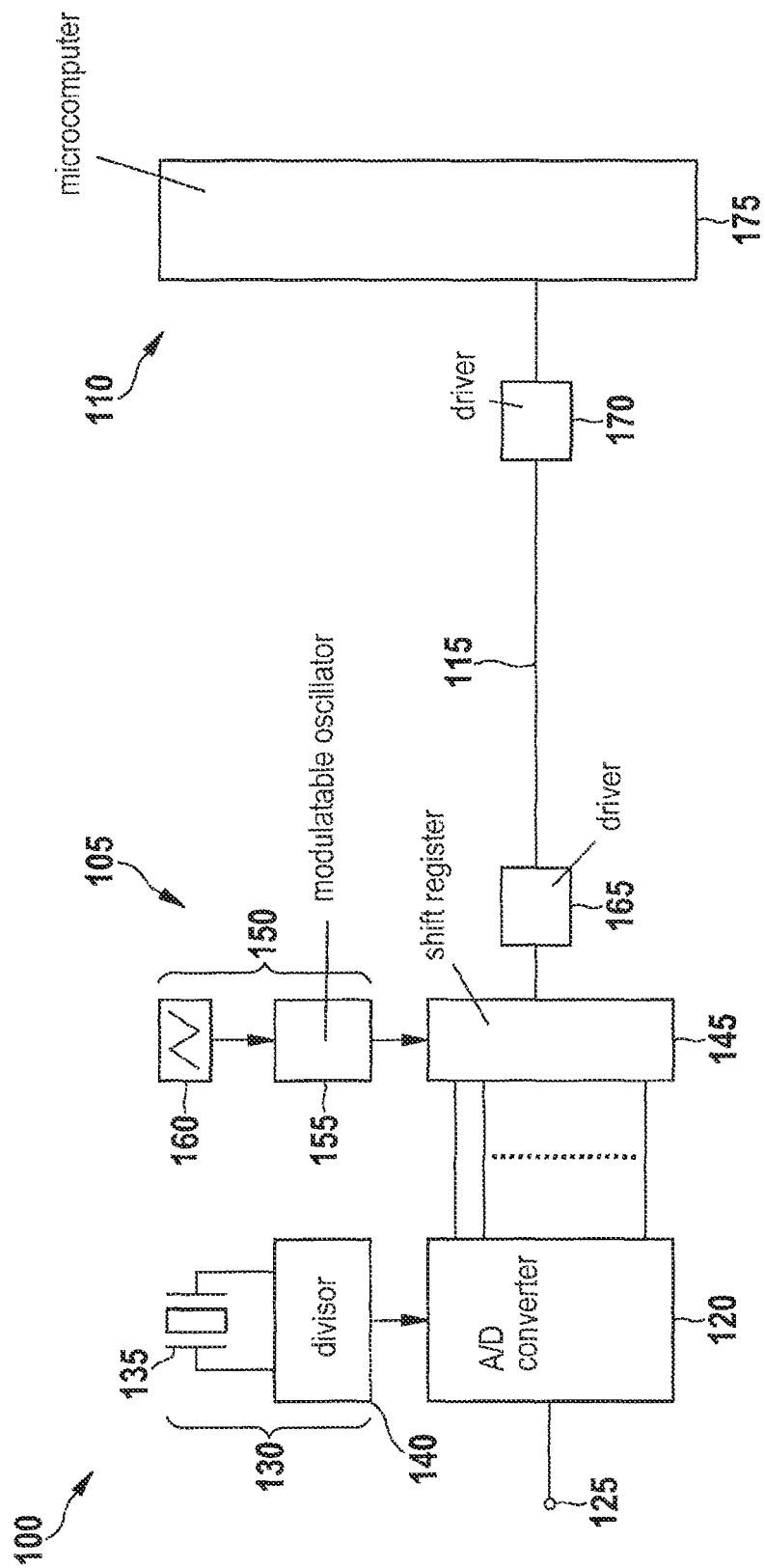
FIG. 1 shows a system for transmitting digital data via a line.

FIG. 1 shows a system 100 for transmitting digital data via a line.

System 100 includes a transmission device 105, a receiving device 110, and a line 115 which connects the transmission device to the receiving device.

Transmission device 105 includes an analog-digital converter 120 for scanning a measured variable that is present at a port 125, which is connected to analog-to-digital converter 120. Analog-digital converter 120 operates on the basis of a clock signal supplied by a timing generator 130. Timing generator 130 includes a quartz-crystal oscillator 135 and a divisor 140. In other specific embodiments, clock generator 130 may also be configured on the basis of a ceramic oscillator, an RC element or an LC element. Regardless, the scanning signal provided by the timing generator has a constant frequency over time, so that analog-digital converter 120 provides measured values at constant intervals.

A sensor having various designs may be connected to port 125, such as an operating element or a data measurement sensor of an engine control, a climate-control system, a security system, a navigation device, a tire-pressure monitoring system or some other control device inside the motor vehicle. The sensor may be integrated into transmission device 105. The values applied at port 125 may later be processed further by programmable microcomputer 175, for instance in the form of a closed-loop or open-loop control.

Analog-digital converter 120 supplies the scanned digital value to a shift register 145 in binary-coded form on a plurality of lines. Shift register 145 accepts the provided parallel data and converts the data into serial data on the basis of a clock signal.

The clock signal for shift register 145 is supplied by a clock generator 150, which includes a modulatable oscillator 155 and a modulation source 160. Modulatable oscillator 155 is a voltage-controlled oscillator (VCO), and modulation source 160 provides a sectionally linear modulation signal. The supplied modulation signal may have the form of a triangle, a sawtooth or a trapezoid, for instance. Accordingly, the frequency of the clock signal supplied by modulatable oscillator 155 is linearly variable over time in sections.

The data serialized by means of shift register 145 are placed on line 115 with the aid of a driver 165.

Line 115 preferably is a two-wire line, and it is possible to use an asymmetrical (single-ended) and a symmetrical (differential) configuration. An additional wire or an additional wire pair may be provided to transmit the variable clock signal. Line 115, for example, may be developed as coaxial, parallel or twisted line. In addition, one or multiple shield(s) may be disposed in the area of line 115. In a still further development, line 115, which is a triple or multi-wire line, transmits a differential signal provided by driver 165.

The line signal transmitted by means of line 115 is terminated by an additional driver 170 on the side of receiving device 110. Drivers 165 and 170 correspond to each other and define physical transmission parameters across line 115, e.g., a transmission voltage, a differential operation, and an impedance of line 115.

The line signal, converted by additional driver 170, is forwarded to a programmable microcomputer 175, which reconstructs the transmitted data therefrom. In one preferred specific embodiment, microcomputer 175 is set up to further process the reconstructed data. Such further processing may include a manipulation, combination, storage and/or forwarding of the data.

Figure 2:
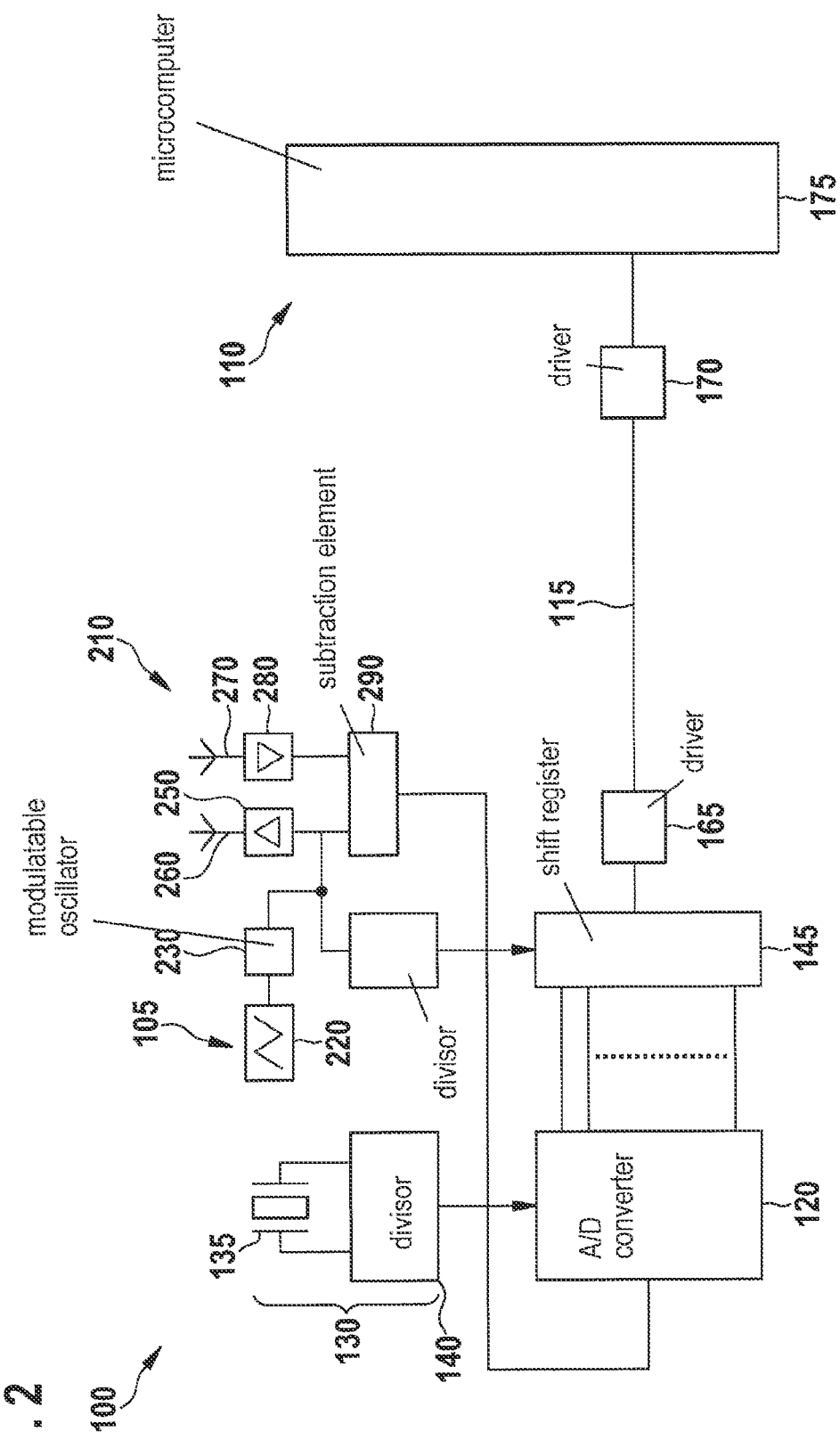
FIG. 2 shows a further specific embodiment of the system from FIG. 1 as part of a radar sensor.

FIG. 2 shows another specific embodiment of system 100 from FIG. 1 as part of a radar sensor 210. In contrast to the specific embodiment described above with reference to FIG. 1, the clock signal for shift register 145 is provided in a different manner, and analog-digital converter 120 scans a signal which is supplied by an element of radar sensor 210.

Radar sensor 210 includes a modulation source 220, which generally corresponds to the afore-described modulation source 160. Modulation source 220 provides a modulation signal to a modulatable oscillator 230. As described above with reference to modulatable oscillator 155 from FIG. 1, modulatable oscillator 230 supplies a clock signal, which is modulated according to the modulation signal. A divisor 240 divides the clock signal by a predefined constant, which is a power of two in one preferred specific embodiment, so that divisor 240 is easy to be set up as a cascade of flip-flops, for example.

In addition, the clock signal is forwarded to an output amplifier 250, which amplifies the signal and radiates it via a transmitting antenna 260. A reflection of the radiated signal at an object is received by a receiving antenna 270 and amplified by means of a receiving amplifier 280. A subtraction element 290 forms a difference between the clock signal and the amplified received signal.

Without any further description of radar sensor 210 and its variation possibilities, the difference provided by subtraction element 290 is proportional to a relative velocity or to a distance of an object that reflects the signal emitted to receiving antenna 270 by means of transmitting antenna 260, to antennas 260 and 270. As described above, the difference and supplied by subtraction element 290 is scanned with the aid of analog-digital converter 120. The transmission of the scanned values via line 115 takes place as described earlier with reference to FIG. 1.

Figure 3:
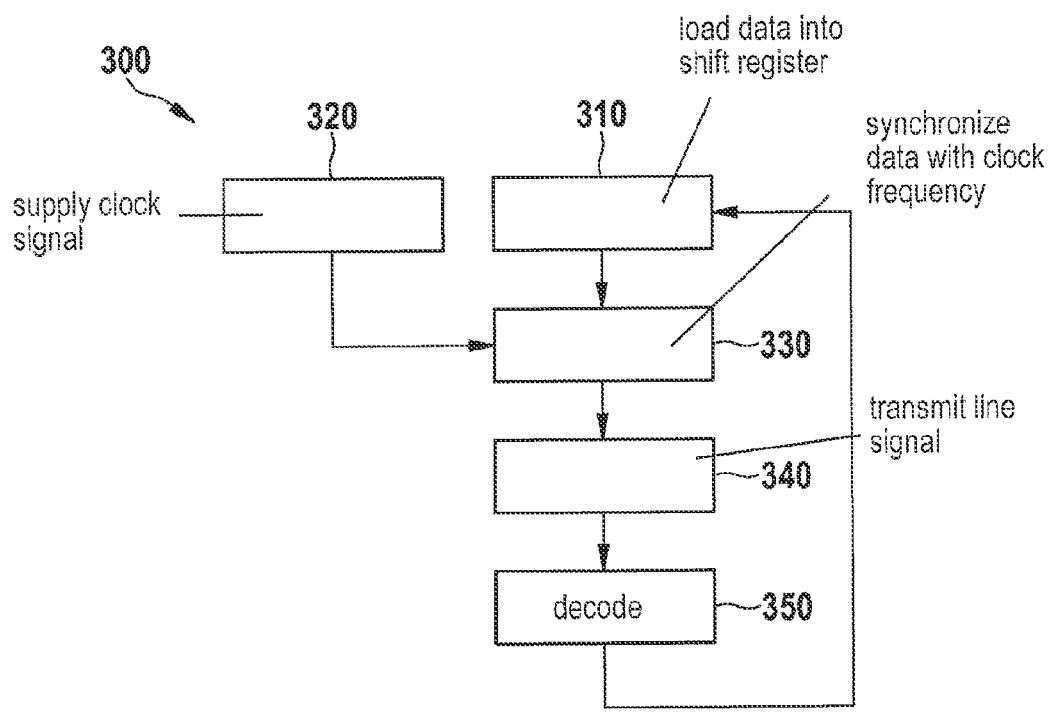
FIG. 3 shows a flow diagram of a method for transmitting digital data via a line.

FIG. 3 shows a flow diagram of a method 300 for transmitting digital data via a line. Method 300 is particularly suitable for an execution by systems 100 of FIGS. 1 and 2.

In a first step 310, data are loaded into shift register 145 for the transmission. In a step 320, which is independent thereof, a clock signal having a variable clock frequency is supplied simultaneously. In a preferred manner, the clock frequency is linearly varied in sections, for which purpose a sectionally linear modulation signal is able to be generated and supplied to a variable clock generator.

In a step 330, the data are synchronized with the clock frequency in a shift register 145, so that the data are serialized using the clock of the clock frequency, and the serialized data are provided in synchrony with the clock frequency in a line signal. In a subsequent step 340, the supplied line signal is transmitted via line 115.

The data from the line signal then are decoded in a step 350 and finally made available in a step 360. Method 300 thereupon branches back to step 310 and may be run through again.

What is claimed is:

1. A method for transmitting digital data via a line, comprising:

providing a clock signal;

transmitting the digital data in synchrony with the clock signal along a first line, the clock signal having a frequency that is variable over time; and transmitting the clock signal via a second line parallel to the first line;

wherein the digital data represents the measured values provided by a scanning device with a scanning signal having a constant frequency generated by a timing generator independent of the clock signal frequency.

2. The method as recited in claim 1, wherein the clock signal frequency is linearly variable in sections.

3. The method as recited in claim 1, wherein the digital data are serially transmitted in binary code.

4. A system for transmitting digital data, comprising:

a transmission device;

a receiving device; and a first line for transmitting a line signal from the transmission device to the receiving device;

wherein the transmission device includes: (a) a clock generator to provide a clock signal that is variable over time, and a synchronization device to provide the line signal on the basis of a synchronization of the data with the clock signal, and (b) a scanning device to scan a measured variable, the digital data representing measured values provided by the scanning; and wherein the receiving device includes a decoding device to decode the data from the line signal transmitted via the line; and a second line for transmitting the clock signal from the transmission device to the receiving device; and a timing generator which is independent of the clock generator to generate a scanning signal having a constant frequency for controlling the scanning device.

5. The system as recited in claim 4, wherein the line has only one physical channel for transmitting information.

6. The system as recited in claim 4, wherein the synchronization device includes a conversion device to convert parallel digital data into serial digital data.

7. The system as recited in claim 4, wherein the transmission device includes a radar sensor.

8. The system as recited in claim 4, wherein the transmission device includes a programmable microcomputer.

* * * * *